(12) United States Patent
Gu

(10) Patent No.: US 10,230,388 B2
(45) Date of Patent: Mar. 12, 2019

(54) SYSTEM AND METHOD FOR ENERGY EFFICIENT TIME DOMAIN SIGNAL PROCESSING

(71) Applicant: Northwestern University, Evanston, IL (US)

(72) Inventor: Jie Gu, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 15/385,188

(22) Filed: Dec. 20, 2016

(65) Prior Publication Data

US 2017/0194982 A1 Jul. 6, 2017

Related U.S. Application Data

(60) Provisional application No. 62/272,770, filed on Dec. 30, 2015.

(51) Int. Cl.
*H03M 1/82* (2006.01)
*G04F 10/00* (2006.01)
*H03M 1/44* (2006.01)

(52) U.S. Cl.
CPC ............ *H03M 1/82* (2013.01); *G04F 10/005* (2013.01); *H03M 1/44* (2013.01)

(58) Field of Classification Search
CPC ............................... H03M 1/82; G04F 10/005
USPC .......................... 341/144, 155, 143, 152, 166
See application file for complete search history.

(56) References Cited

U.S. PATENT DOCUMENTS

| | | | | |
|---|---|---|---|---|
| 3,692,943 | A * | 9/1972 | Thelemaque | H04Q 3/00 379/245 |
| 4,605,921 | A * | 8/1986 | Riddle | H04L 25/4904 341/52 |
| 9,014,216 | B2 * | 4/2015 | Lazar | A61B 5/0002 370/521 |
| 2010/0138218 | A1 * | 6/2010 | Geiger | G10L 19/02 704/205 |

OTHER PUBLICATIONS

Miyashita, D.; Yamaki, R.; Hashiyoshi, K.; Kobayashi, H.; Kousai, S.; Oowaki, Y.; Unekawa, Y. "A 10.4 pJ/b (32,8) LDPC Decoder With Time-Domain Analog and Digital Mixed-Signal Processing," IEEE International Solid State Circuits Conference, 2013, 3 pages.
Miyashita, D.; Yamaki, R.; Hashiyoshi, K.; Kobayashi, H.; Kousai, S.; Oowaki, Y.; Unekawa, Y. "An LDPC Decoder With Time-Domain Analog and Digital Mixed-Signal Processing," IEEE J. Solid-State Circuits, 49, 2014, pp. 73-83.

* cited by examiner

*Primary Examiner* — Peguy Jean Pierre
(74) *Attorney, Agent, or Firm* — Benesch, Friedlander, Coplan & Aronoff LLP

(57) ABSTRACT

Time domain signal processing (TDSP) encodes information into time rather than voltage with high efficiency. Circuit level design techniques can also reduce the area and energy consumption of TDSP. Design examples on both conventional signal processing blocks and emerging facial recognition applications can be used to demonstrate the potential of the techniques. On a 45 nm CMOS technology, more than about 45% area and energy reduction can be simultaneously achieved from TDSP compared with standard CMOS techniques in emerging applications.

20 Claims, 15 Drawing Sheets

SYSTEM AND METHOD FOR ENERGY EFFICIENT TIME DOMAIN SIGNAL PROCESSING

CROSS-REFERENCE TO RELATED APPLICATIONS

This patent application claims the benefit of U.S. Provisional Patent Application No. 62/272,770, filed on Dec. 30, 2015, the entire contents of which is incorporated by reference in its entirety.

BACKGROUND

The scaling of CMOS technology has been a driving force for area and power reduction of Very Large Scale Integration (VLSI) integrated circuits. Each generation of CMOS technology has produced a well predicted cost and energy reduction in proportional to the scaling of the size of minimum transistors. For area reduction, besides the technology scaling, the rapid development of highly efficient synthesis tools utilize sophisticated logic optimization method to eventually produce the minimum technology mapping of target functionality. On the other hand, the energy of conventional CMOS circuits are proportional to $CV^2$ where C is the capacitance of the circuits defined by the logic functionality and further optimized by design automation tools. Hence, the reduction of energy consumption of the logic circuits has been mainly relying on the reduction of supply voltages. For example, tremendous efforts have been put on developing near-threshold computing technique to reduce the energy consumption of the chip. Meanwhile, many emerging low power techniques have been developed. For example, many variety of Razor technique have been proposed to detect timing error and recover the pipeline operation allowing supply voltage to scale beyond its nominal rating.

Recently, approximating computing has drawn significant attention by showing significant energy efficiency improvement if small errors can be tolerated. Although not all applications are error tolerant, large amount of emerging applications such as image processing, facial recognition, and the more recent neuromorphic computing are all in favor of trading off small amount of accuracy for power consumption which has been the bottleneck of modern battery operated devices. Similarly, previously proposed stochastic computing exploits the statistical significance of the computation and introduces error correction scheme to correct error from the most-significant bits due to voltage overscaling. Essentially, a new design optimization space is explored where functionality is slightly traded off in exchange of a large return of the energy consumption. Despite of the different methodologies used in various low power design techniques, the energy reduction has all relied on voltage scaling leaving the C relatively fixed from the logic synthesis.

The analog signal processing which has well been explored decades ago, offers several attractive features: (1) Because multiple bits information can be encoded within single signal at multiple voltage levels, it offers more energy efficient way for signal generation and processing compared with bit-wise digital signals; (2) Analog signal processing is more error resilient because the error probability drops exponentially with the position of significant bit. As a result, there is an increase of interest on utilizing analog signal processing for conventional digital signal processing applications. However, significant drawbacks also exist for analog signal processing. First of all, the static current consumption from an analog circuit can offset its energy benefits especially for low power design where the switching frequency is low. Secondly, the requirement of headroom for analog circuits to remain in saturation prevent the design from using low supply voltages causing diminishing benefits from technology scaling. As a result, analog signal processing has not been used prevalently for providing energy or area benefits.

To reduce the cost of integrated circuits, the chip area needs to be reduced but may not be possible due to the required functionality. Similarly, the energy consumption is limited by the required functionality. Conventional integrated circuits for digital signal processing have reached a bottleneck of energy and area consumption and are hard to be improved. Known conventional design methodology cannot further reduce area and energy of the design.

Time domain signal processing has been previously introduced, but (1) previous works utilized a conventional delay unit based on standard cells which are not energy efficient, fundamentally limiting the benefits of the previous work. As a result, no energy benefits was reported despite of the promise of the technique. (2) No systematic design methodology and modeling technique has been provided for designing a general purpose TDSP circuits. (3) Only special design of a Low-density Parity-Check (LDCP) was presented in previous works leaving the design strategy unknown for more generally used building blocks of signal processing, such as multiplier.

DESCRIPTION

The systems and methods can reduce the area and energy of computer processing chips via design and/or information processing. In one aspect, the systems and methods provide signal processing where the information is encoded not in voltage, but in time, which is cheaper in area and energy. Time domain signal processing (TDSP) can encode information into time rather than voltage with high efficiency. In some embodiments, the systems and methods include (1) a double encoding non-complementary logic design, contrary to the conventional Complementary Metal Oxide Semiconductor (CMOS) logic design; and (2) energy efficient time encoding circuits compared with earlier designs. The time domain signal processing can show strong benefits for applications in both conventional digital signal processing and emerging technical fields including facial recognition, neural network, neuromorphic computing, etc. In some embodiments, the double encoding non-complementary design may reduce energy and area consumption by up to about 50% compared with existing solutions. In some embodiments, the energy efficient time encoder may reduce energy and area consumption by up to about five times compared with existing solutions.

Figure 1:
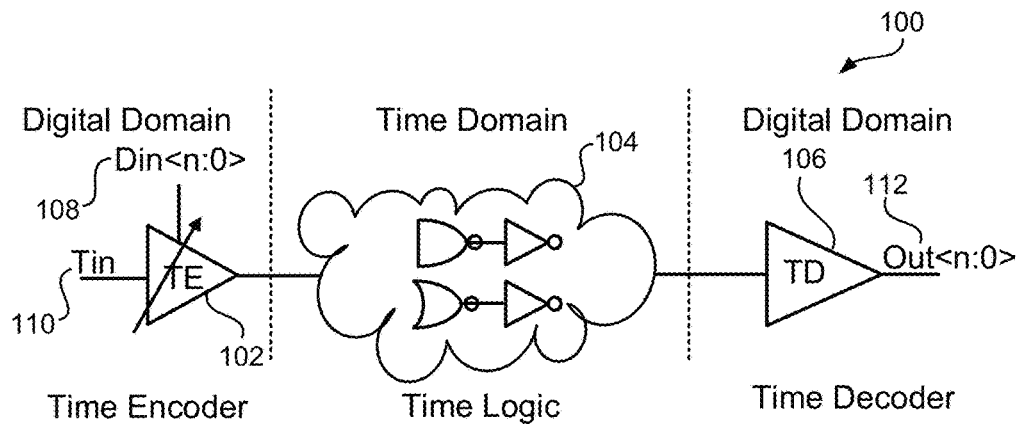
FIG. 1 is a block diagram of an example system overview of timing domain signal processing.

FIG. 1 is a block diagram of an example system 100 of timing domain signal processing. In some embodiments, the system 100 includes a time encoder 102, time logic 104 and time decoder 106. Time domain signal processing encodes information into time instead of voltage as in conventional signal processing. As described below, TDSP processes information in time where energy and area consumption is more efficiently used than its binary logic counterpart. As a result, TDSP can break an existing energy barrier of conventional designs. For the sake of explanation, a general design for energy efficient signal processing in time domain is described, including but not limited to: (1) example energy efficient time domain circuits with about more than three times improvement on energy efficiency compared with previous schemes; (2) a physical model on delay and energy to formulate the design principles of the building blocks; (3) a double-encoding processing strategy to further improve an efficiency of TDSP; (4) an example case study on both general purpose DSP block, e.g., multiplier and emerging facial reorganization application to illustrate the general design principle of TDSP along with quantitative comparison in area, power and delay with conventional logic design methodology. Section 2 describes design principles and analysis on TDSP design along with circuit design techniques. Section 3 presents modeling of energy and delay of the building blocks. Section 4 provides case study of TDSP with example simulation results compared with conventional design. Section 5 includes a conclusion.

2. Time Domain Signal Processing Principle

This section describes the basic principle of TDSP with simplified models and compares its theoretical benefits with conventional signal processing scheme.

2.1 Time Domain Signal Processing Overview

TDSP transfers the task of signal processing into "time" which can be processed more efficiently compared with traditional digital signal processing (DSP). In FIG. 1, the digital binary inputs 108 are encoded with time Tin 110 by time encoder 102, processed in time domain by time logic 104, and reconverted back into digital domain by the time decoder 106 to output the processed signal 112. Although the information is encoded in the time domain, the information carriers are still binary digital signals processed by conventional logic circuits, such as inverters, NAND gates or NOR gates, making the technique easy to be designed in advanced CMOS technology. Not all components have to be present in the system 100. For example, the time decoder (TD) 106, which is also refereed as time-to-digital converter (TDC), can be eliminated in some applications as shown later. The time encoder 102 (also refereed as digital-to-time converter) can be combined with the time logic 104 to further simplify the design.

The information that is processed in time domain does not follow the energy and area consumption relationship with the logic functionality as in conventional digital signal processing, leading to a fundamental reduction of the design cost.

2.2 Energy Efficient Time Encoder

To encode the information into time, e.g. delay of logic gates, a simple inverter can be used.

Figure 2A:
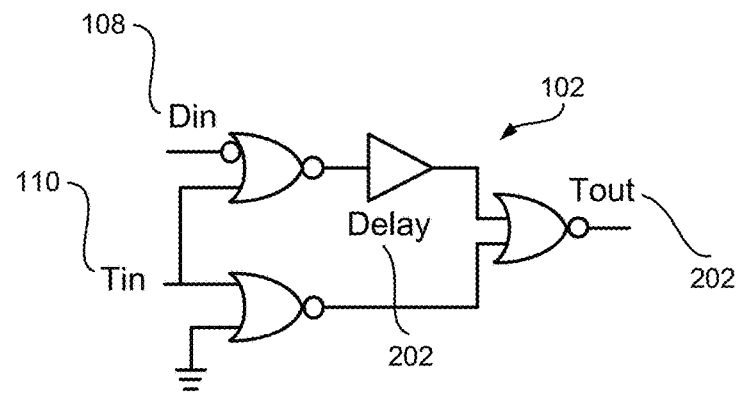
FIG. 2A is circuit diagram of an example time encoder.

FIG. 2A is circuit diagram of an example time encoder 102. In FIG. 2A, a simple known 1-bit time encoder 102 outputting Tout 200 can be based on a logical mux operation. By enabling or disabling a longer logic path, a delay 202 of operation in proportion to the binary inputs can be generated. Such an encoding strategy can require multiple gates and has an energy consumption in proportional with the number of bits encoded.

Figure 2B:
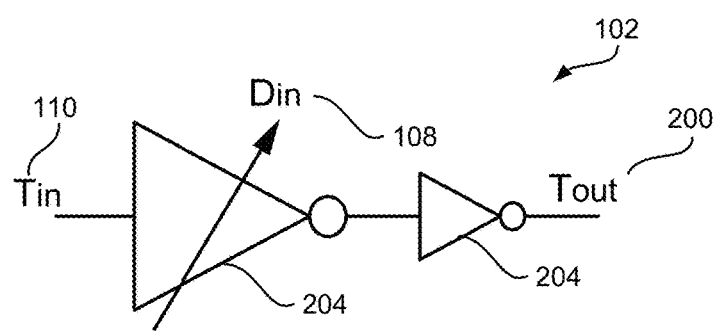
FIG. 2B is a circuit diagram of an example inverter based energy efficient time encoder.

FIG. 2B is a circuit diagram of an example inverter based energy efficient time encoder 102. In FIG. 2(b), an energy efficient time encoder 102 is illustrated where multi-bit can be encoded with only one inverter 204. The input bits are used controlled the strength of Pull-up/Pull-down network to achieve the modulation of the delay. The second inverter 204 is used to recover the slew rate loss from the first encoder to reduce the delay impact to the later stages. Compared with FIG. 1A, an area and energy saving of about three times can be achieved. Multi-bits can be encoded into simple stage with almost no impact to the energy consumption, e.g., a constant value of two inverters 204. Different from conventional stacking of transistors, the stacked transistors are always turned on and do not experience large signal swing leading to very small energy consumption. Details on delay and energy models are described in section 3.

Figure 2C:
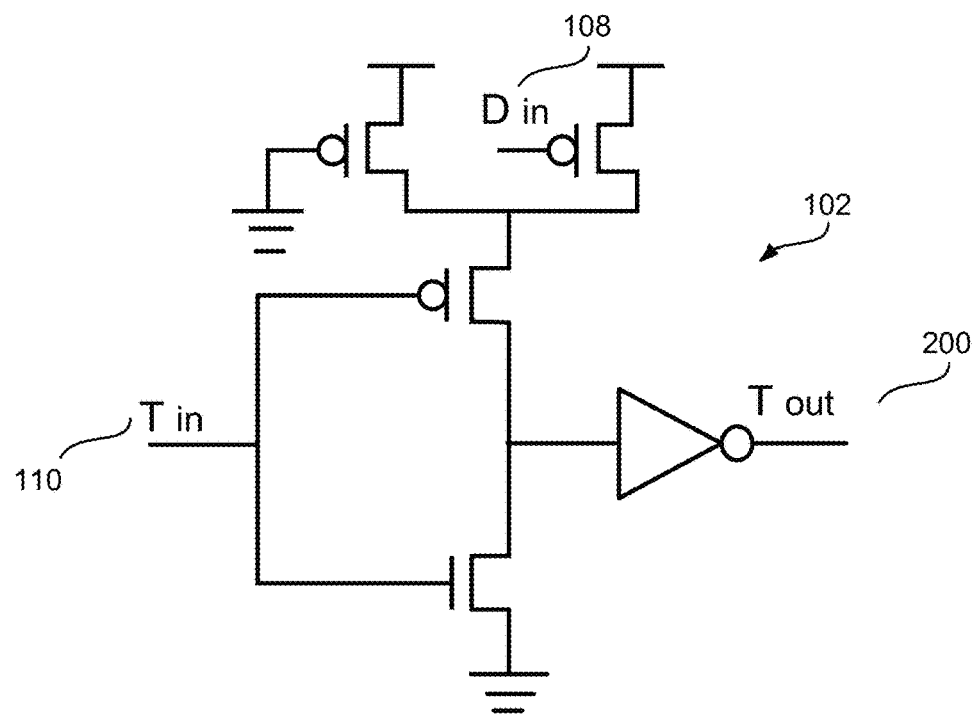
FIG. 2C is a schematic of an example 1-bit time encoder design.
Figure 2D:
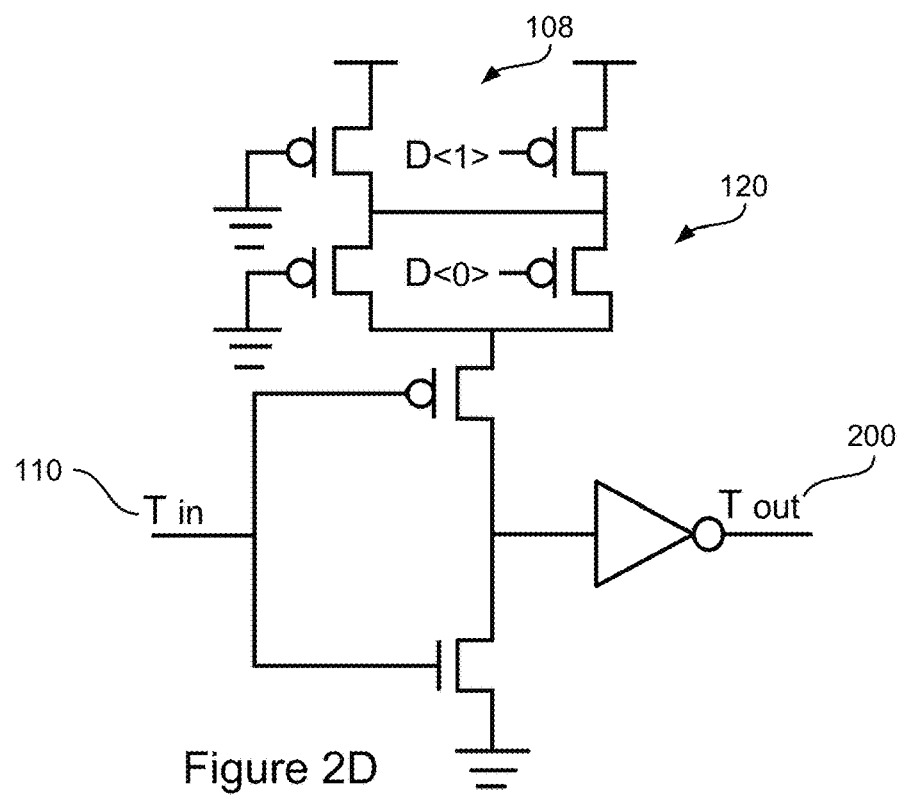
FIG. 2D is a schematic of an example 2-bit time encoder design.

FIG. 2C is a schematic of an example 1-bit time encoder 102. FIG. 2D is a schematic of an example 2-bit time encoder 102.

2.3 Energy Efficient Time Logic Design

Figure 3A:
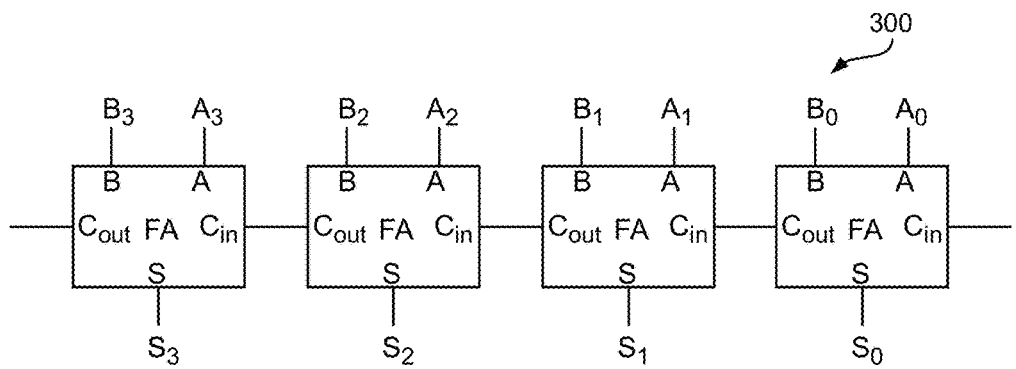
FIG. 3A is a schematic of an example ripple-carry adder.
Figure 3B:
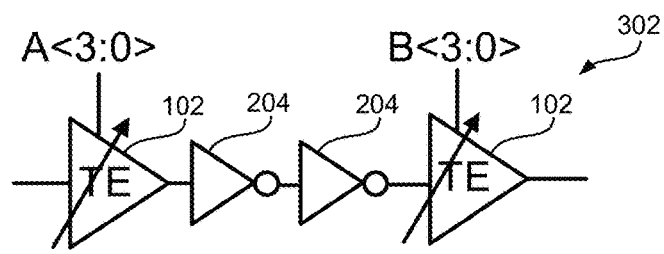
FIG. 3B is a schematic of an example time-domain adder.

This section describes an example time logic design. FIG. 3A is a schematic of an example ripple-carry adder 300. FIG. 3B is a schematic of an example time-domain adder 302.

One example of time domain signal processing block is the time-domain adder 302 in FIG. 3B, including two cascaded time encoders 102 and two inverters 204 to remove slew rate impacts among stages. The time encoders 102 can designed as described in previous session. FIG. 3A shows a known ripple-carry adder for comparison.

Figure 4A:
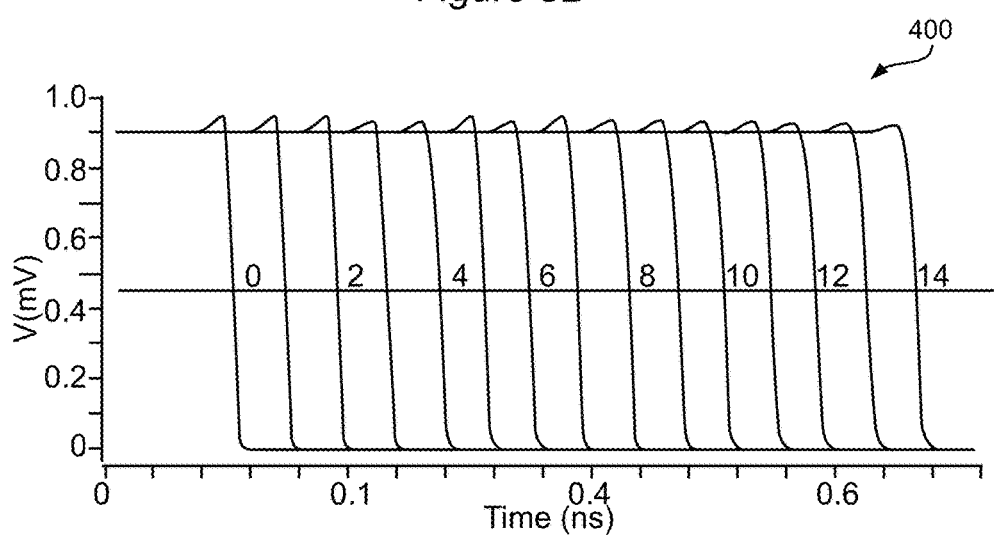
FIG. 4A is a graph of an example simulated output waveforms of the 3-bit adder.

FIG. 4A is a graph of an example simulated output waveforms of the 3-bit adder.

Figure 4B:
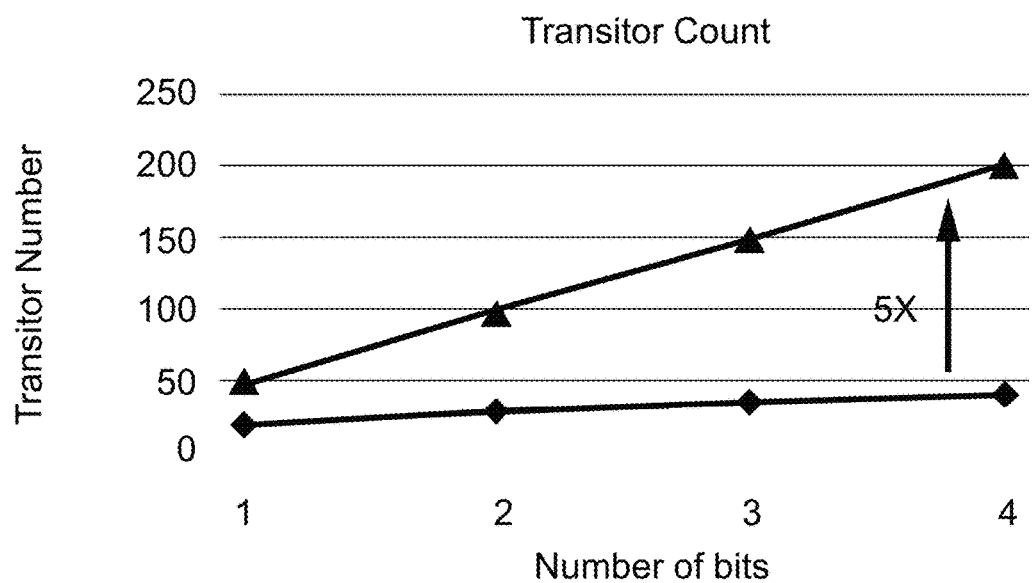
FIG. 4B are graphs of an example energy and area comparison between a conventional design and TDSP design.
Figure 4B:
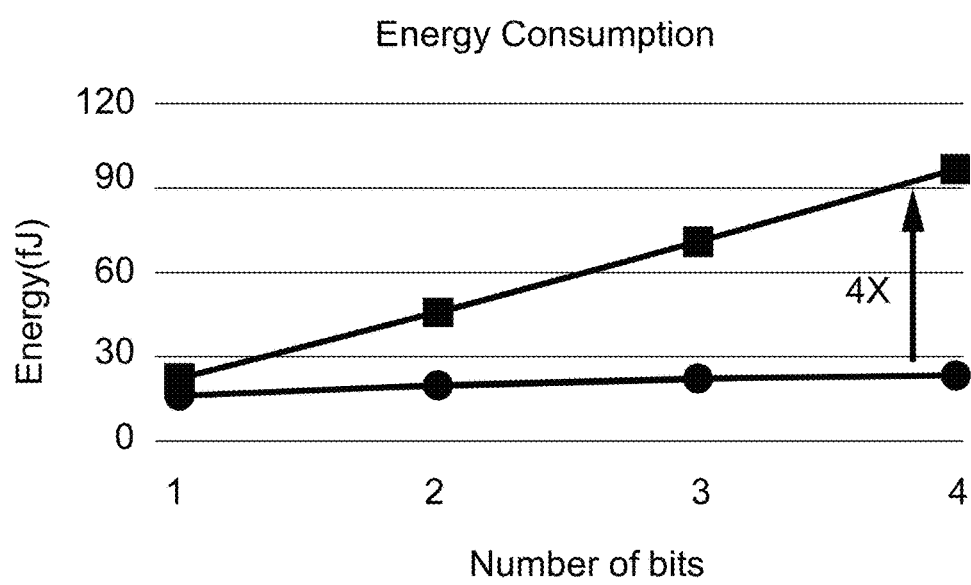
Figure 5A:
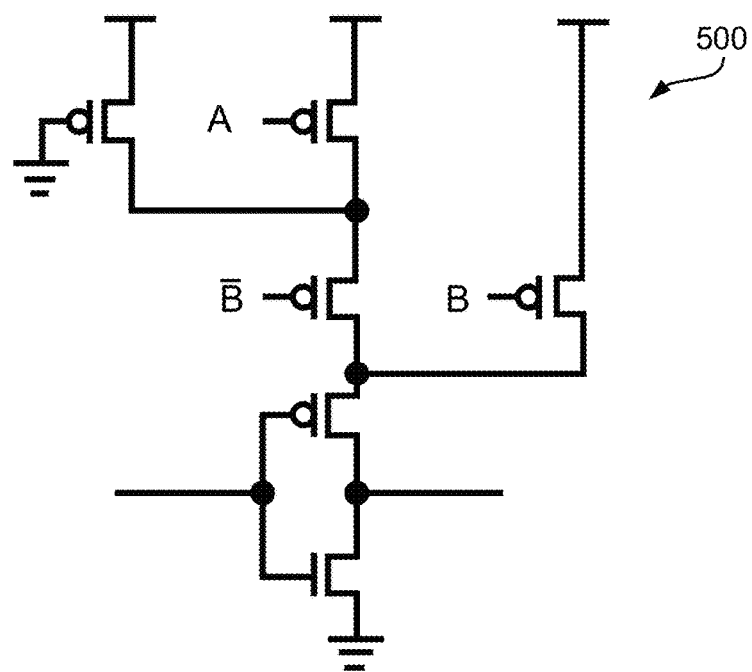
FIGS. 5A-F are schematics of simple time logic for (A) AND; (B) Mux; (C) Min; (D) Max; (E) Compare; and (F) Shift (constant Add).
Figure 5B:
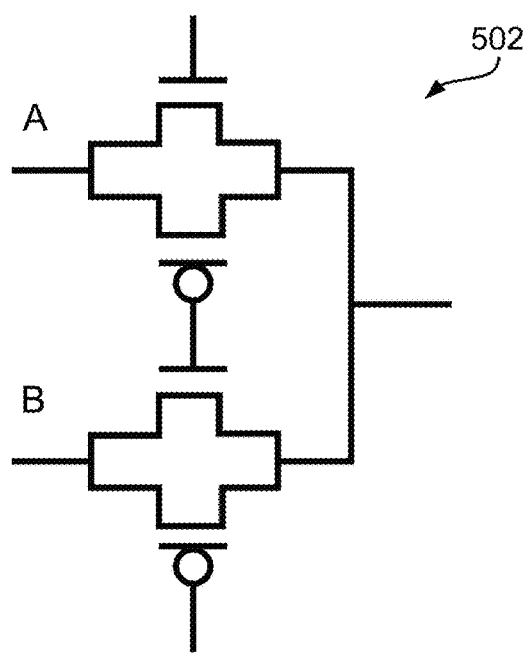
Figure 5C:
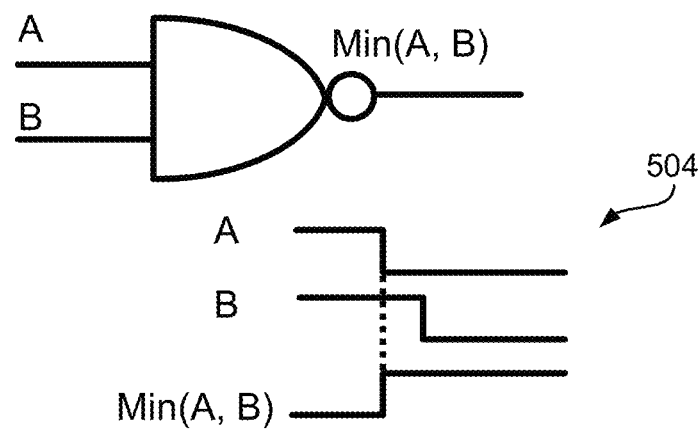
Figure 5D:
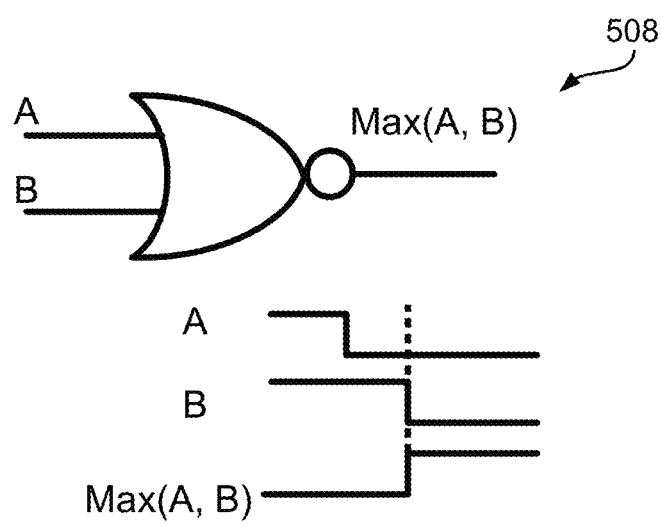
Figure 5E:
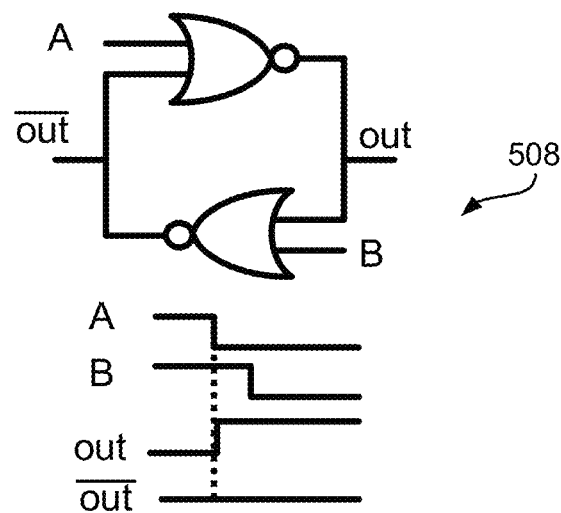
Figure 5F:
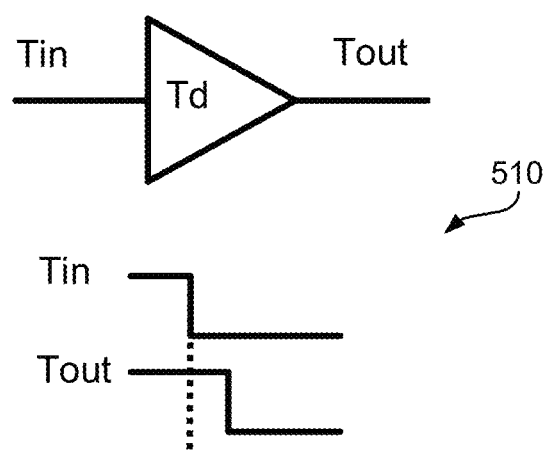

FIG. 4B are graphs of an example energy and area comparison between a conventional design and TDSP design. In FIG. 4A, the example waveform 400 is illustrated of a 3-bit adder in 45 nm CMOS technology at a supply of 0.9V. In this example, a single-bit delay of 20 ps is used, which is twice of the typical delay of a single inverter delay in the same technology. The choice of 2 times of single inverter design is to improve the robustness of the design from process variation. In FIG. 4B, a comparison in energy and area consumption is illustrated with conventional Ripple-Carry adder designed in the same technology and condition. As can be observed in some examples, a 4-5× saving on area and energy can be achieved compared with conventional designs. In addition, the energy consumption does not grow linearly with the number of bits in time domain design, which changes the fundamental energy and area tradeoff with logic functionality in conventional signal processing.

FIGS. 5A-F are schematics of simple time logic for (A) AND 500; (B) Mux 502; (C) Min 504; (D) Max 506; (E) Compare 508; and (F) Shift 510 (constant Add). Some of them such as (E) Compare 508, (D) Max 506, (C) Min 504 can be realized using one or two digital logic gates compared with conventional design rendering advantages in special applications as discussed in section 4.2.

2.4 Double-Encoding Non-Complementary Logic Operation

This section describes a signal processing scheme.

Figure 6A:
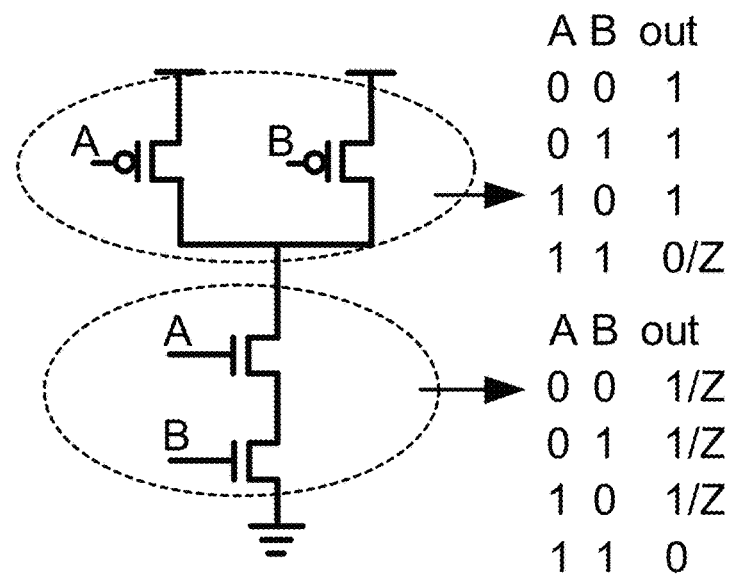
FIG. 6A is a schematic of a conventional complementary logic.
Figure 6B:
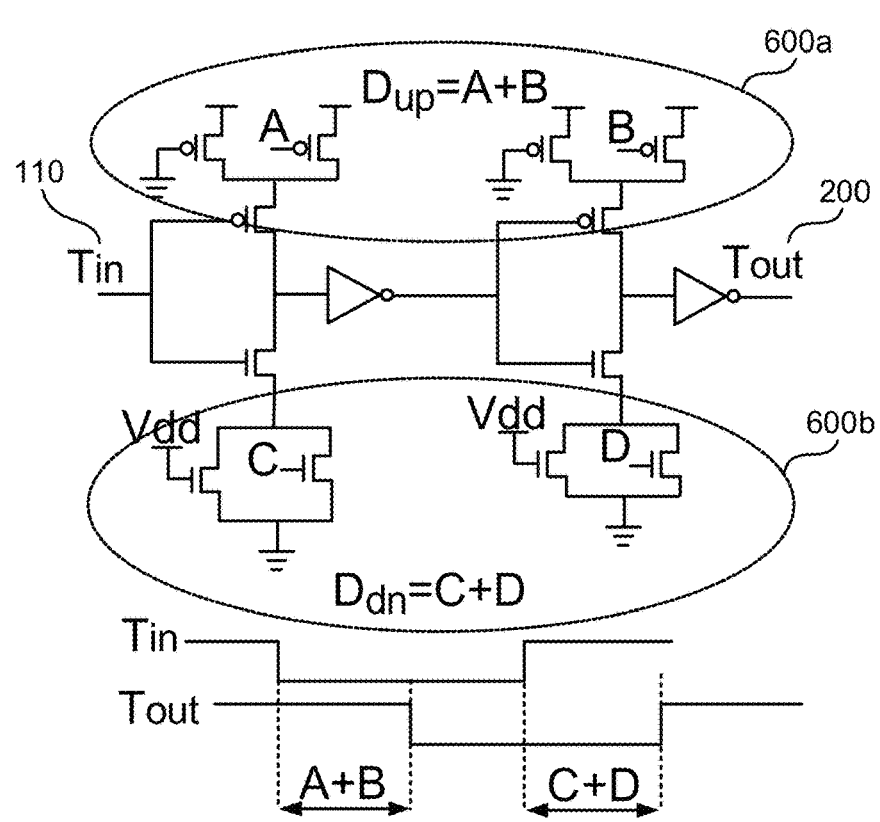
FIG. 6B is a schematic of two 1-bit adders using a double-encoding non-complementary design.

Conventional logic design is constructed using complementary design with pull-up and pull-down realizing equal functionality (ignoring high impedance state). As a result, a logic redundancy is observed in conventional CMOS design. Because the operation in TDSP is essentially an inverter operation with controlled delay, the pull-up and pull-down can be used to implement entirely different logic function. FIG. 6A is a schematic of a conventional complementary logic. FIG. 6B is a schematic of two 1-bit adders 600a-b using a double-encoding non-complementary design. For rising and falling edge operation, the circuit performs two different logic operation. Because for any single gate, energy is only consumed during the rising edge of the output, the energy consumption of the described scheme is about 50% of the normal single-encoding scheme in some examples. Area consumption is also reduced by about 33% in some examples because the buffer stage is shared for both rising and falling transition. An example simulation can verify that the pull-up and pull-down operation can be completed decoupled without delay impact to each other as long as the input slew rate is not too slow, which is guaranteed from adding inter-stage buffers.

2.5 Time Decoder Design

Time decoder (TD) 106, or time-to-digital converter (TDC) can be implemented in an All-digital Phase-locked-loop (ADPLL) design with the state-of-art TDC achieving 1 ps resolution. However, existing TDC is both area and power consuming due to the stringent requirement of jitter performance especially for high performance analog and mixed-signal design. The time decoder 106 used in time domain signal processing has much relaxed specification in terms of resolution requirement as the resolution can be chosen to be 10~20 ps or larger, an order of magnitude larger than that in ADPLL design. As a result, it is possible to implement a time decoder 106 with high area and energy efficiency suitable for digital signal processing application which is highly sensitive for cost.

Figure 7:
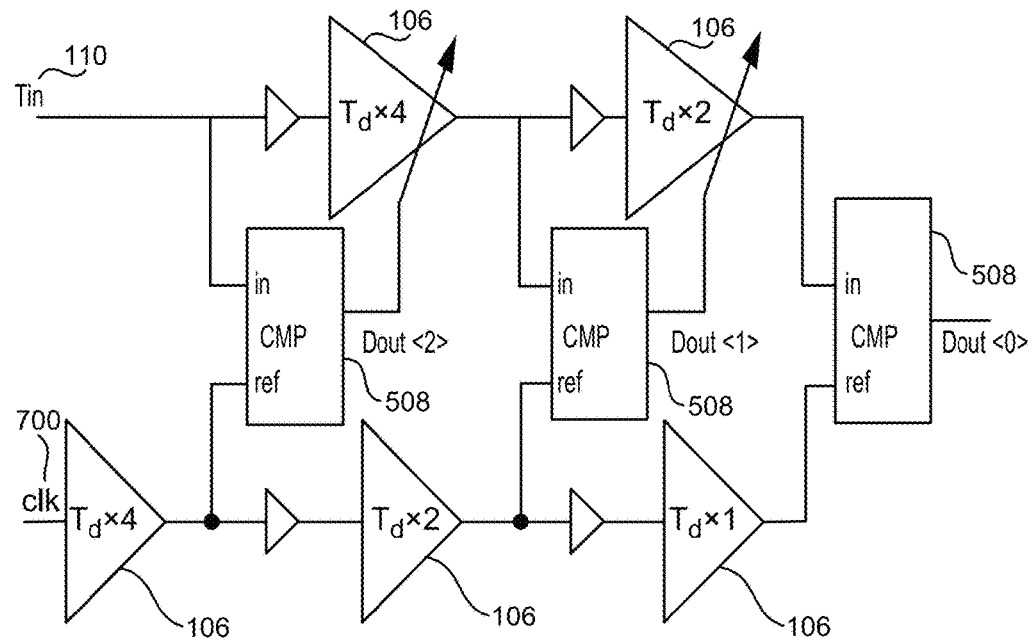
FIG. 7 is a schematic of an example 3-bit time decoder design using binary search.

A double-encoding scheme can be implemented into the time decoder 106 design to further cut down the power and area consumption. FIG. 7 is a schematic of an example 3-bit time decoder design using binary search with Tin 110 and a clock (clk) 700 as inputs. The building blocks of time decoder 106 can include (1) constant delay elements or time "Shift", (2) time "Compare", (3) 1-bit time encoder, using design strategy presented in section 2.2 and 2.3 with double-encoding scheme, e.g., two operations in rising and falling cycles. Small delay elements are inserted to allow sufficient time for time comparator 508 to make decision during the search. For time decoding, the reference clock 700 can be generated globally on the same chip as the other elements. However, similar to existing ADPLL design, calibration may be used in TDSP to remove process variation induced offset and nonlinearity in delay elements and clock generation. The latch based time comparator used here can be combined with another latch to construct the functionality of conventional flip-flop and thus does not introduce area or energy overhead compared with conventional pipeline flip-flops.

3. Delay and Energy Model for TDSP 3.1 Simplified Delay Model for Time Encoder

Figure 8A:
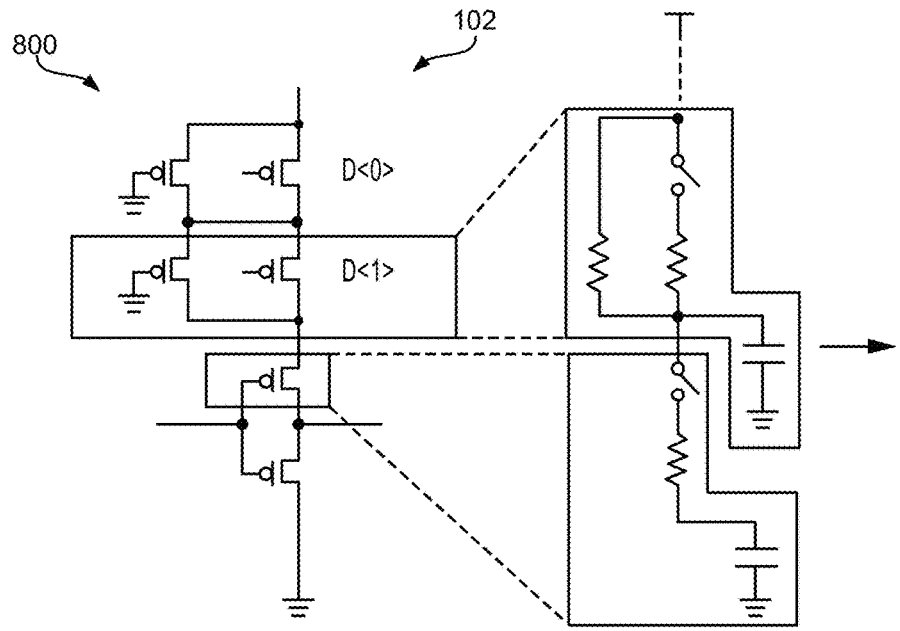
FIGS. 8A-B are schematics of an example time delay circuit for the time encoder including (A) an RC model of time encoder and (B) a time model of time encoder.
Figure 8B:
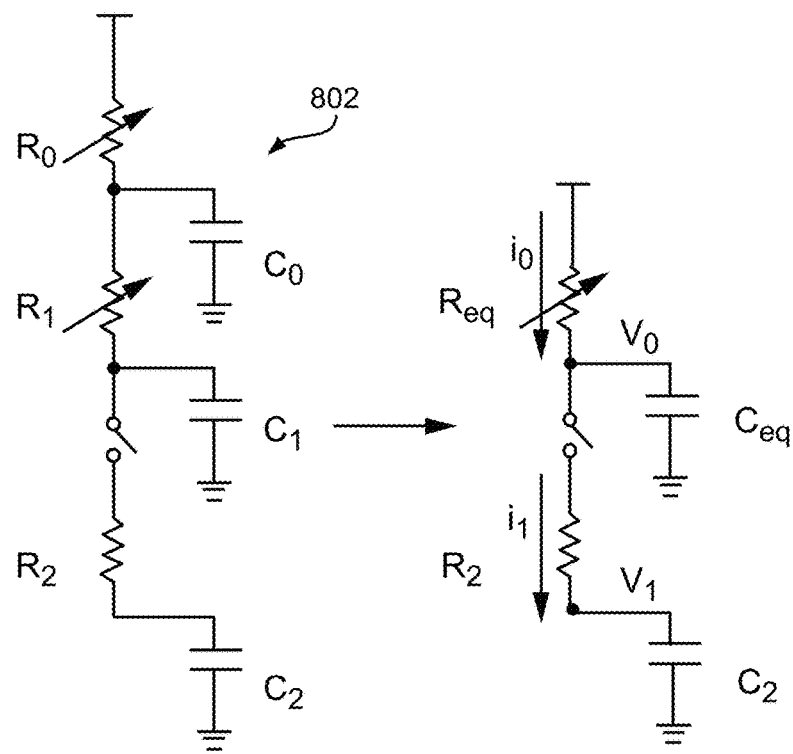

In this section, a simplified delay model is described for the energy-efficient time encoder circuits. FIGS. 8A-B are schematics of an example time delay circuit for the time encoder including (A) an RC model of time encoder and (B) a time model of time encoder. Recall that a single transistor can be simply modeled as a combination of a resistor and a capacitor in particular operating region. FIGS. 8A-B show a simplified model of pull-up branch (PMOS) of the energy-efficient time encoder circuit.

The time encoder 102 has a sophisticated topology based on a single inverter which is shown in FIG. 8A, in which several transistors 800 are cascaded in serial in both pull-up and pull-down (not shown) branches.

In this case, representation of the delay of the time encoder 102 become complicated, in which the delay cannot only be simply described in a way of Elmore delay model. In FIG. 8B, the delay time 802 can be described as the time of charging the capacitor C2. The process of charging the capacitor C2 can be decomposed into two steps: (1) charge sharing between C0, C1 and C2; (2) Direct RC charging by V0.

$$R_{eq} = R_0 + R_1 \quad (1)$$

$$C_{eq} = C_1 + \frac{R_0}{R_0 + R_1} C_0 \quad (2)$$

In an example real simulation in Cadence, these two steps are observed. During the transition, i0 is nearly 0 at the very beginning, which means most of charge flows to C2 is provided by Ceq. This can be approximated as a charge sharing progress. As i0 increases to about half of the i1, the charge sharing progress is then replaced by a direct RC charging progress. This progress lasts until V1 reaches half of Vdd. In the real simulation, the V0 stays constant during the RC progress, which means the V0 can be approximately seen as the constant voltage source in this progress.

The charge sharing which happens first is between Ceq and C2 through the resistor R2. Note that Ceq is already charged to Vdd before the charge sharing progress. This progress ends at the point when i0 reaches half of the i1. At this point V0 and V1 can be calculated as following:

$$2 \frac{V_{dd} - V_0}{R_{eq}} = \frac{V_0 - V_1}{R_2} \quad (3)$$

$$C_2 V_1 = C_{eq}(V_{dd} - V_0) \quad (4)$$

-continued $$i_0 = \frac{(V_{dd} - V_0)}{R_{eq}} \quad (5)$$

At the end of the charge sharing, $$i_1 = 2i_0 \quad (6)$$

From (3) and (4), V0 and V1 can be derived:

$$V_0 = \frac{2C_2 R_2 V_{dd} + C_{eq} R_{eq} V_{dd}}{[C_{eq} R_{eq} + C_2 R_{eq} + (2R_2 + R_{eq})C_{eq}]} \quad (7)$$

$$V_1 = \frac{C_{eq}[V_{dd}(2R_2 + R_{eq}) + 2R_2 V_{dd}]}{[C_2(2R_2 + R_{eq}) + C_{eq} R_{eq}]} \quad (8)$$

The duration of charge sharing t1 can be determined as following:

$$t_0 = \tau_0 \ln\left(\frac{V_{dd} - V_1}{V_{dd}}\right) \quad (9)$$

$$\tau_0 = R_2 \frac{C_{eq} C_2}{C_{eq} + C_2} \quad (10)$$

The duration of direct RC charging t2 can be determined as following:

$$t_1 = \tau_1 \ln\left(\frac{V_0 - V_1}{V_0 - 0.5V_0}\right) \quad (11)$$

$$\tau_1 = R_2 C_2 \quad (12)$$

The total delay time tdelay of the time encoder:

$$t_{delay} = t_0 + t_1 \quad (13)$$

Example simulation result matches the results of equation well with only 10% difference. However, those equations may be too complex to be utilized in the real designs. Simplification can be made based on observations that the second progress dominates over 90% of the whole progress and $R_2$ is highly related to the linear summation of R0 and R1 due to the current relationship between R0, R1 and R2. As a result, the delay can be further simplified into a linear equation of R0 and R1.

$$t_{delay} \approx \tau_1 = R_2 C_2 \approx 0.7(R_0 + R_1)C_2 \quad (14)$$

Equation (14) matches closely with example simulation results providing a qualitative method for designing time encoder.

3.2 Energy Model of Time Encoder

Figure 9:
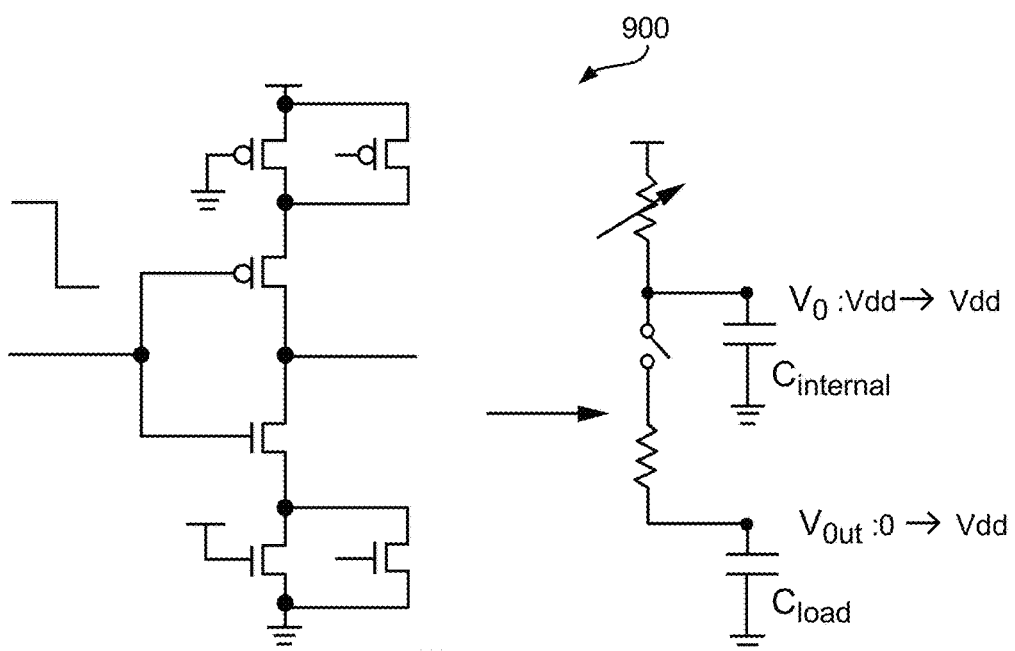
FIG. 9 is a schematic of an example energy model of the 1-bit time encoder.

FIG. 9 is a schematic of an example energy model 900 of the 1-bit time encoder.

Note that the energy consumption only happens during the falling transition of the input signal. In this way the energy consumption of the time encoder can be calculated as:

$$E = C_{load} V_{dd}^2 \quad (15)$$

Beside this, there is short current flow occurs during the transition which is about 10% of the total energy consumption of the time encoder. Equation (15) shows that the stacked transistors above do not increase energy consumption of the time encoder, which has been verified by the example simulation.

Example Case Study of TDSP Design

Case Study 1: TDSP Multiplier

As there has been no existing demonstration of a general purpose multiplier circuits using TDSP, a 4-bit multiplier is used as an example to elaborate the described designs. Multiplication is an important and computation costly building blocks in digital signal processing. Its operation involves excessive addition and AND operations where TDSP can implement in a more efficient way.

Figure 10:
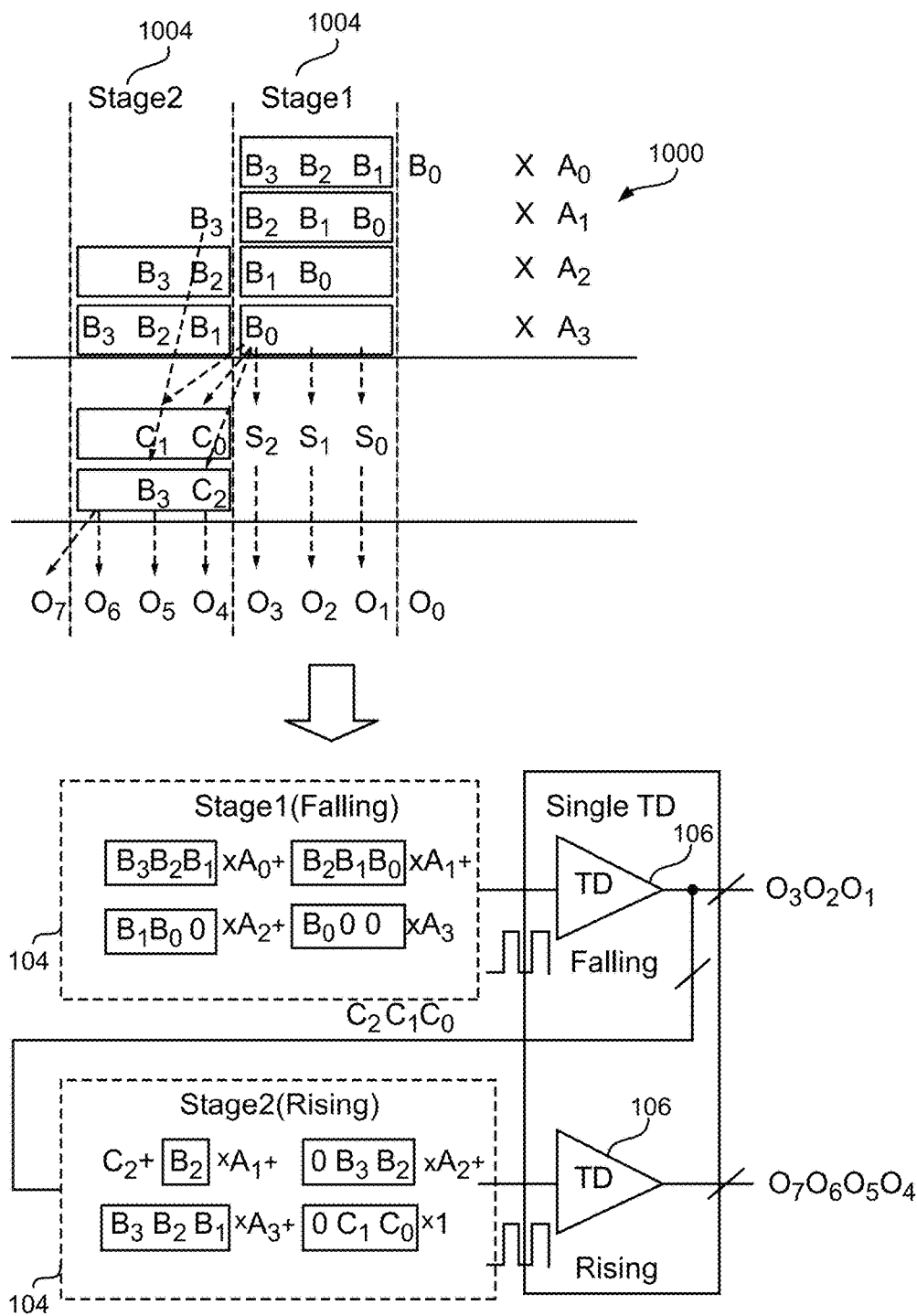
FIG. 10 is a circuit diagram of an example algorithm of a TDSP-Multiplier.

Advantages of operating the addition operation are shown in the previous section. This section provides an example of a conventional multiplier using TDSP elaborating the design techniques. FIG. 10 is a circuit diagram 1000 of an example algorithm of a TDSP-Multiplier. Based on the left-shift multiplication algorithm of achieving the multiplication, the TDSP-multiplier converts the multiplicand into time domain and operates the addition in time domain as well. The algorithm is divided into two subsequent operation utilizing both falling edge and rising edge of the time domain operation which consists of addition and AND operation similar to what is described in 2.2. Although two stages 1004 of time logic 104 and two time decoders 106 as shown in FIG. 10 present the two logic partition, they are physically designed in the same adder chains and time decoder 106 utilizing the double-encoding strategy. Carry bits from time decoder 106 from first falling edge operation are propagated back into the same adder chains for the subsequent rising operation. Three bit time decoder 106 are used in this design with overflow detection and simple delay subtraction circuits to handle overflow situation without extending into four bits of time decoder 106.

Both transistor level schematic and physical layout have been designed for comparison of area and energy consumption in a 45 nm CMOS technology. Conventional design can be performed using normal synthesis and backend placement. The area and energy consumption between conventional multiplier and TDSP-multiplier are shown in Table 1. The TDSP multiplier without time decoder 106 is also shown to illustrate the dominant contribution from time decoder 106 which shows that such a technique is better utilized when time decoder 106 can be eliminated as shown in the next example case study. In some examples, significant area saving of about 40% and 35% of energy saving can be observed. The delay of TDSP is relatively large mainly due to the use of time decoder 106 and the encoding of information into time domain. However, delay drawbacks can be overcome as shown in the next example case study.

TABLE 1

Area and energy consumption comparison of multiplier.

| | Conventional | TDSP | TDSP w/o TD |
|---|---|---|---|
| Energy (fJ) | 198 | 143 | 44 |
| Area (μm2) | 150 | 90 | 24 |
| Delay (ns) | 0.5 | 1.2 | 0.76 |

Case Study 2: TDSP Winner-Take-all

Applications including facial recognition for object tracking, and popular neuromorphic computing schemes, etc. require large amount of non-linear signal processing operation such as comparison (CMP), sorting (SORT), minimum (MIN), maximum (MAX), etc. Among them, winner-take-all (WTA) or loser-take-all (LTA) are building blocks in pattern classification and artificial neural networks, where a deterministic decision is made based on excessive compare and sorting which is costly to be implemented in standard CMOS design. Given the benefits for TDSP for the non-linear signal processing block, a 6-bit WTA circuit can be implemented in comparison with standard CMOS implementation.

Figure 11:
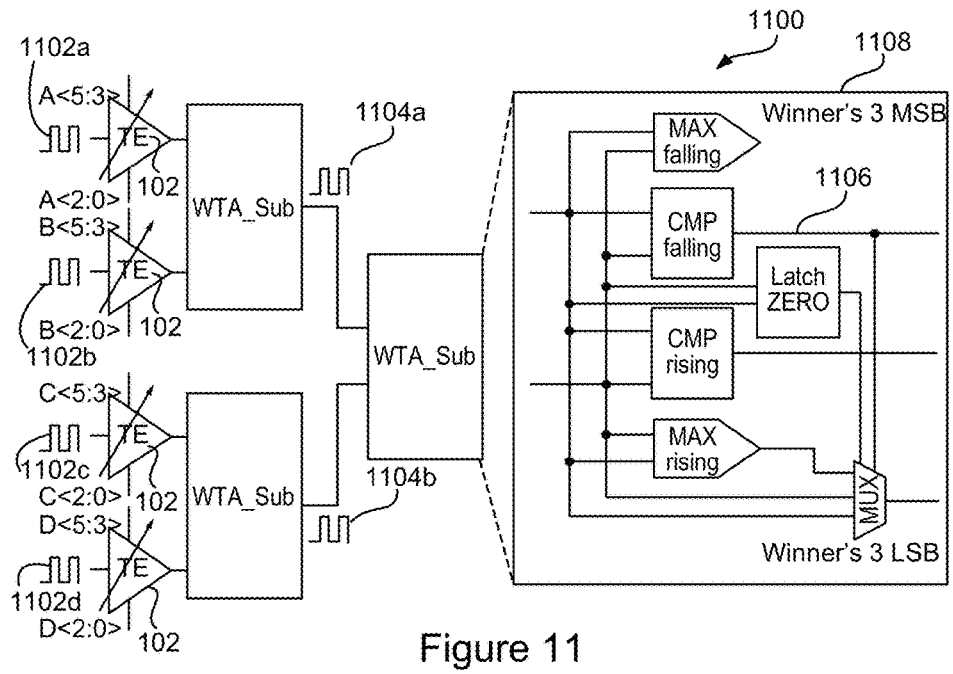
FIG. 11 is a circuit diagram of an example winner-take-all (WTA) scheme.

FIG. 11 provides an algorithm and circuit diagram 1100 of 6-bit TDSP-WTS. The WTA functionality compares four inputs' values 1102a-d and generate a 2 bit output 1104a-b to represent the largest input of the four. Because extensive comparison and sorting needs to be made, conventional logic design does not implement this function efficiently. However, in the TDSP design, the comparison can be simply made in time domain leading to significant advantages. In FIG. 11, besides encoding each of 3 bits into pull-up and pull-down network, the MAX function (single NAND gate) can be utilized to output the winner of the first-level comparison to the second-level. Because the bits' operation is split into two groups, a latch based zero detector 1106 can be used to resolve an equal case for most-significant-bits 1108.

Figure 12A:
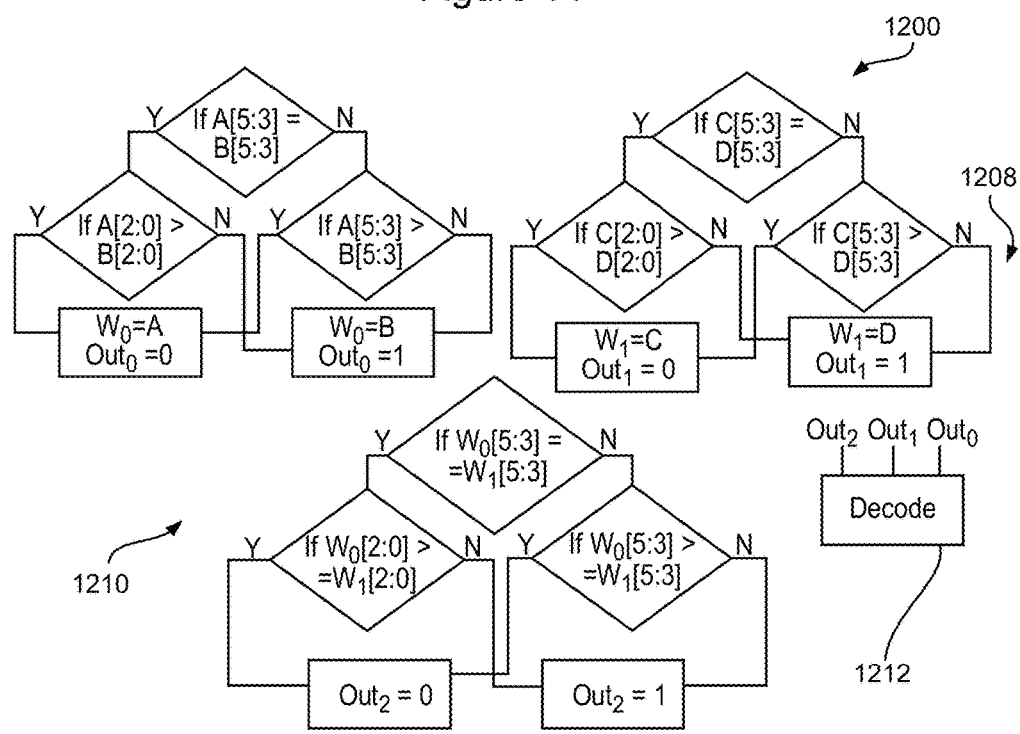
FIGS. 12A-C are example flow/circuit diagrams of example winner-take-all algorithm, winner-take-all circuit, and hybrid equal detector.
Figure 12B:
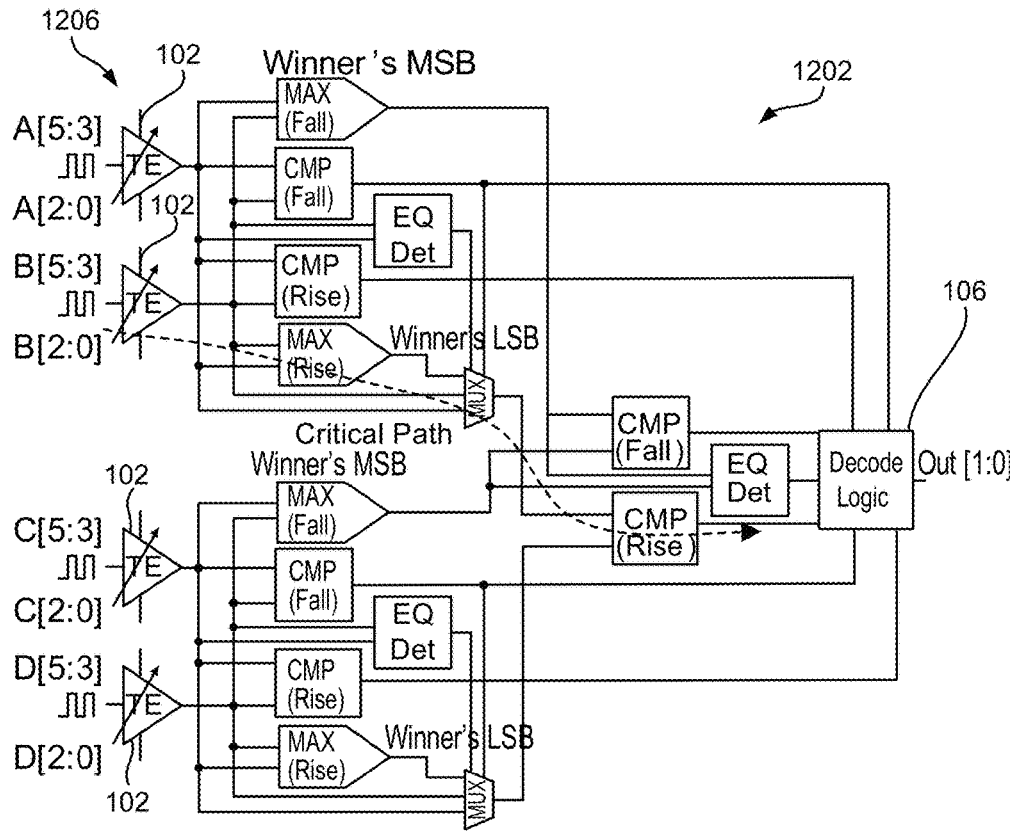
Figure 12C:
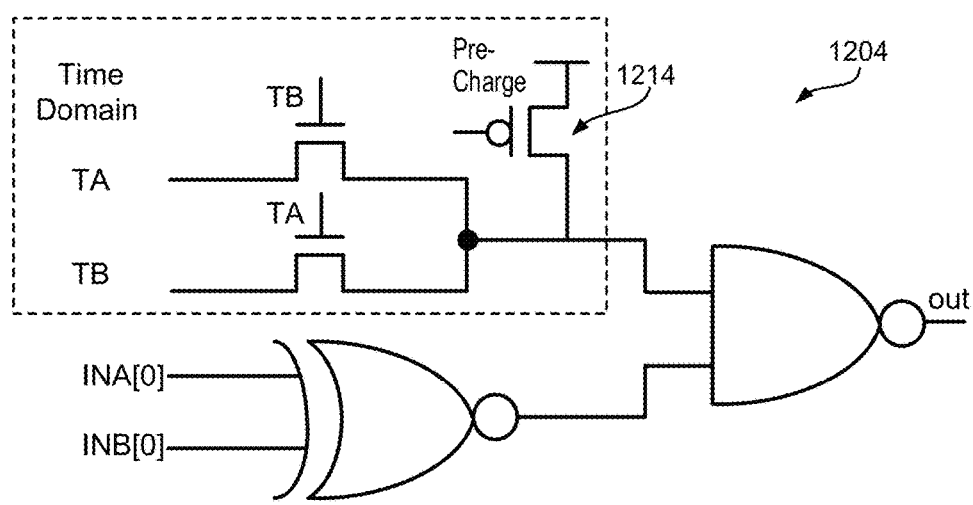

FIGS. 12A-C are example flow/circuit diagrams of example winner-take-all algorithm 1200, winner-take-all circuit 1202, and hybrid equal detector 1204, e.g., to explore the potential of TDSP design utilizing TDSP's advantages of the non-linear operation. Many applications such as image processing, facial recognition, require large amount of non-linear signal processing operations such as comparison, sorting, minimum, maximum, etc. Among them, winner-take-all (WTA) or loser-take-all (LTA) can be an important building block commonly used for pattern classification where a deterministic decision is made based on excessive compare and sorting operation which are highly expensive to be implemented in standard CMOS ASIC design and even more difficult for a CPU operation. An example 4-input 1206, 6-bit WTA circuit can be compared with a standard CMOS implementation. The use of 6-bit is to highlight a bit-scalable design technique from which more number of bits can be implemented for TDSP. The idea of WTA is based on binary comparison tree shown as FIG. 12A. The winner of each branch in first stage 1208 is calculated in parallel and then sent to the second stage 1210 to be compared again. The largest input of the four can be represented by decoding 1212 the comparator results. Because extensive comparison and sorting may need to be made, conventional logic design does not implement this function efficiently. FIG. 10B provides the circuit diagram of an example 6-bit TDSP WTA design. After converting the digital value into time domain, the comparison can be simply made by using comparator, e.g., discussed above. In addition, a MAX function (single NAND or NOR gate) can be used to directly pass the output of the winner from the first-stage comparison to the second stage without intermediate restoration or regeneration. As a result, a highly parallel operation can be achieved in TDSP without any replication of computing among inputs. Below includes a few techniques that can be used in this design to achieve high efficiency in delay and energy.

Bit-Scalable Design for TDSP

Although a single stage of TDSP design may be limited by 3 to 4 bits, a bit-scalable design can be realized by separating multi-bits input into subgroup operation. In this example, the operation of MSB[5:3] and LSB[2:0] are separated computed using the dual-encoding technique. A complication for splitting the inputs into sub-groups comes from the handling of "equal" case when the inputs of MSB[5:3] are to be compared because the TDSP CMP can only provide "larger/smaller or equal" result. The operation on LSB[2:0] operation is only needed if the results on MSB[5:3] are "equal". Although the equal can be realized by using XOR gates in conventional logic gate design, the time domain operation can be reused to achieve higher efficiency. FIG. 10C shows an example the time domain equal detector. A precharge signal 1214 is used to precharge the internal node to high. The output is discharged to ground only when the inputs are sufficiently separated in time. The separation is controlled by the discharge time of the internal node. Although the time domain "equal" detector can detect signals far apart, e.g., more than 1 bit away, an ambiguity region happens for two signals not sufficiently separated due to random process variation. To remove the impact of process variation, a one bit CMOS XOR gate is also used to provide a determined result for equality of the least significant bit. By combining the CMOS operation and time domain operation, an ambiguity region due to process variation can be removed leading to accurate detection of "equal" with higher efficiency than using CMOS XOR gates. Depending on the "equal" result, different signals are chosen for comparison on LSB using MUX gate.

Efficient MAX/MIN/CMP Operation

While it can take significant effort for conventional digital design to perform MAX/MIN/CMP operation, it only takes a single or two logic gates for TDSP to perform the same operation. For example, the determination of the winner can be easily done by using a CMP operation while the passing of winner to the next stage can be simple realized by a NAND/NOR gate. In comparison, it takes entire 6-bit ADD/SUB operation in conventional digital design to realize the above operation.

Parallel Operation with Short Critical Path

Because the winner can be easily passed into the second stage operation using a NAND/NOR gate, the second stage comparison can be achieved immediately without additional restoring efforts as required in conventional design. Hence the critical path in FIG. 10B is extremely short, e.g., only three logic gates, a MUX gate, a NAND gate and a CMP after the time encoder (TE) 102. The short critical path can significantly reduce the variation impact to the design leaving the TE 102 as the most stringent circuit in the design. Although a total of 6 comparators and 3 equal detectors (EDs) 1204 are operating, they are mostly performed in parallel and do not increase critical path.

Figure 13A:
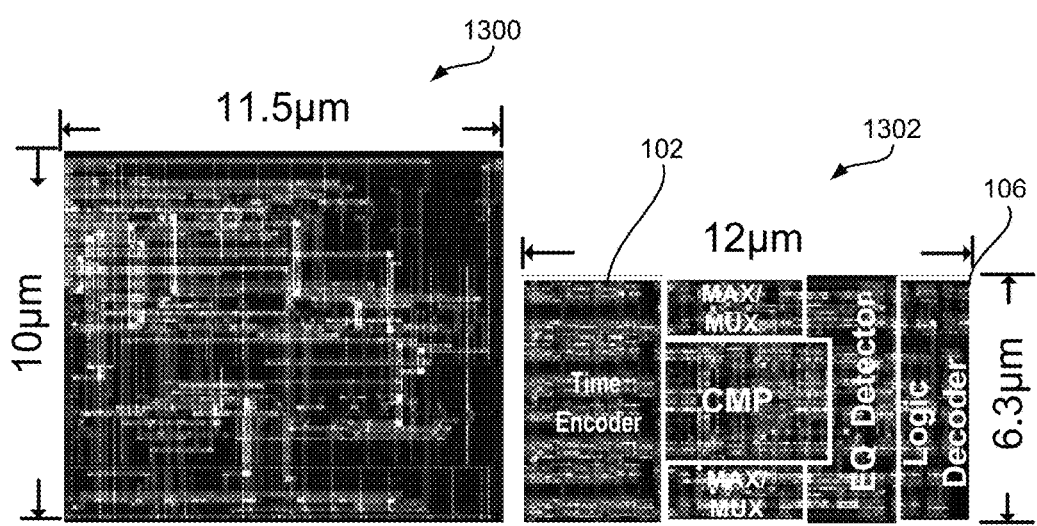
FIGS. 13A-B are example block diagram/graphs of ASIC and TDSP layouts, and energy and delay comparisons.
Figure 13B:
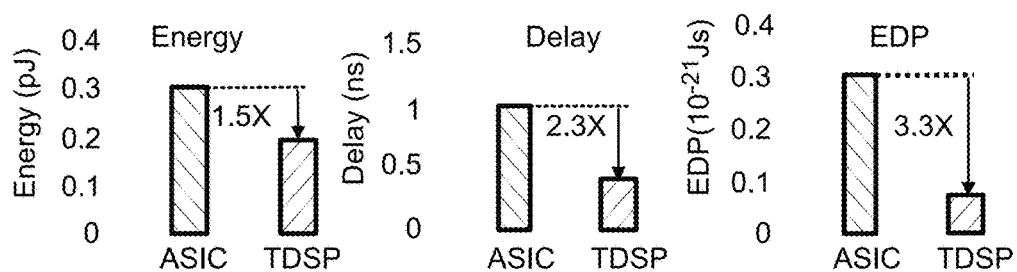

FIGS. 13A-B are example block diagram/graphs of ASIC 1300 and TDSP 1302 layouts, and energy and delay comparisons. In one example, the conventional design and TDSP design can be implemented in the 45 nm technology. Schematic and layout for conventional design can be designed using commercial ASIC design tools for synthesis and place and route while TDSP design was designed using customized schematic and layout. Time encoder 102 and ED 1204 are sized to reduce the variation impact. Monte-Carlo simulation can be used to verify the functionality of the design. FIG. 11A shows the layout comparison of the two design with floorplan highlighted. In some example, an area saving of 34% for TDSP design can be achieved. FIG. 11b shows delay and energy consumption between conventional ASIC design 1300 and TDSP design 1302 based on extracted simulation from layout. A 2.3× delay improvement and about a 31% energy saving can be achieved in TDSP design leading to a total energy delay product (EDP) improvement of about 3.3× for TDSP design versus conventional design. For comparison, energy and delay for CPU can be eliminated to perform the same operation by optimistically counting the numbers of combinational ALU operation and ignoring the register file access overhead. Compared to the CPU operation, the ASIC design achieves about a 7× energy saving and about a 3.2× speed improvement while the TDSP design achieved 10× energy saving and about 8× speed improvement. Table 2 summarizes example design specifications.

TABLE 2

Area and energy consumption comparison of WTA

|  | CPU | Conventional ASIC | TDSP |
|---|---|---|---|
| Technology |  | 45 nm, 1.1 V |  |
| Energy (fJ) | 2304 | 323 | 224.4 |
| Area (μm2) | N/A | 115 | 75.6 |
| Delay (ns) | 3.2 | 0.98 | 0.43 |

Other schematics and layouts can be been done for both conventional ASIC design of WTA and the TDSP. The area and energy consumption between conventional WTA using standard ASIC design flow and TDSP-WTA is shown in Table 3. Overall, TDSP can achieve about 48% energy saving and about 60% area saving. In addition, delay of TDSP design is faster than conventional design due to the elimination of time decoder 106 and simple implementation of the non-linear comparison such as CMP, MAX, MIN highlighting a strength of TDSP technique.

TABLE 3

Area and energy consumption comparison of WTA

|  | Conventional | TDSP |
|---|---|---|
| Energy (fJ) | 201 | 104.4 |
| Area (μm2) | 115 | 47.3 |
| Delay (ns) | 1.1 | 0.6 |

CONCLUSIONS

A design principle, analysis and modeling are described for the time domain signal processing which efficiently encodes the information into time. Several enabling techniques such as double-encoding logics can improve the energy consumption. Example case studies on conventional multiplier design and emerging winner-take-all circuits are shown with more than 45% saving in area and energy achieved simultaneously.

Figure 14:
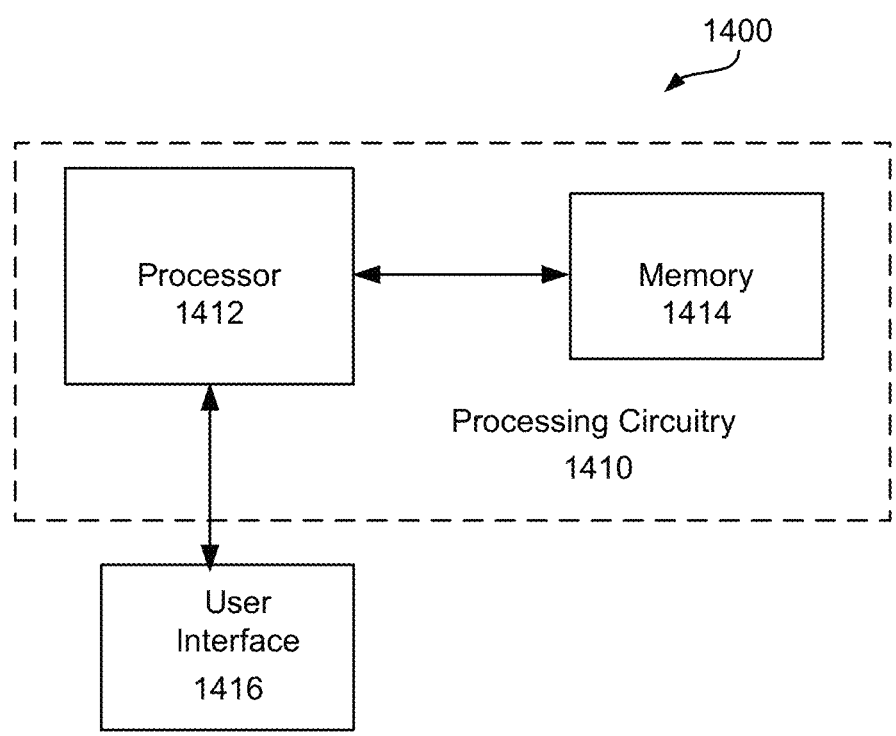
FIG. 14 is a block diagram of an example computing system.

FIG. 14 is a block diagram of an example computing device 1400. The systems and methods described above may be implemented in many different ways in many different combinations of hardware, software firmware, or any combination thereof. In one example, the computing device 1400 may enable the TDSP. It can be appreciated that the components, devices or elements illustrated in and described with respect to FIG. 14 below may not be mandatory and thus some may be omitted in certain embodiments. Additionally, some embodiments may include further or different components, devices or elements beyond those illustrated in and described with respect to FIG. 14.

In some example embodiments, the computing device 1400 may include processing circuitry 1410 that is configurable to perform actions in accordance with one or more example embodiments disclosed herein. In this regard, the processing circuitry 1410 may be configured to perform and/or control performance of one or more functionalities of the TDSP. The processing circuitry 1410 may be configured to perform data processing, application execution and/or other processing and management services according to one or more example embodiments. In some embodiments, the computing device 1400 or a portion(s) or component(s) thereof, such as the processing circuitry 1410, may include one or more chipsets and/or other components that may be provided by integrated circuits.

In some example embodiments, the processing circuitry 1410 may include a processor 1412 and, in some embodiments, such as that illustrated in FIG. 14, may further include memory 1414. The processor 1412 may be embodied in a variety of forms. For example, the processor 1412 may be embodied as various hardware-based processing means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it can be appreciated that the processor 1412 may comprise a plurality of processors. The plurality of processors may be in operative communication with each other and may be collectively configured to perform one or more functionalities of the computing device 1400 as described herein. In some example embodiments, the processor 1412 may be configured to execute instructions that may be stored in the memory 1414 or that may be otherwise accessible to the processor 1412. As such, whether configured by hardware or by a combination of hardware and software, the processor 1412 is capable of performing operations according to various embodiments while configured accordingly.

In some example embodiments, the memory 1414 may include one or more memory devices. Memory 1414 may include fixed and/or removable memory devices. In some embodiments, the memory 1414 may provide a non-transitory computer-readable storage medium that may store computer program instructions that may be executed by the processor 1412. In this regard, the memory 1414 may be configured to store information, data, applications, instructions and/or the like for enabling the computing device 1400 to carry out various functions in accordance with one or more example embodiments. In some embodiments, the memory 1414 may be in communication with one or more of the processor 1412, the user interface 1416 for passing information among components of the computing device 1400.

While various embodiments have been described, it can be apparent that many more embodiments and implementations are possible. Accordingly, the embodiments are not to be restricted.

We claim:
1. A system, comprising:
a digital signal processor including a time encoder, a time logic and a time decoder, where the time encoder, time logic and time decoder are configured to provide time domain signal processing of inputted information in a time domain rather than voltage;
where the time encoder is configured to encode the inputted information in the time domain, where the encoding comprises a double encoding non-complementary logic design,
where the digital signal processor comprises an adder, where the adder comprises two cascaded time encoders and two inverters to remove slew rate impacts among stages, and where the time encoder is configured to control a strength of a pull-up/pull-down network to achieve a modulation of delay.

2. The system of claim 1, where the encoding reduces energy and area consumption by up to about forty percent compared with voltage encoding.

3. The system of claim 1, where the encoding reduces energy and area consumption by up to about three times compared with voltage encoding.

4. A method of signal processing, comprising:
encoding digital binary inputs from a digital domain into a time domain;
processing the digital binary inputs in the time domain;
reconverting the digital binary inputs into the digital domain; and
performing signal processing in the time domain rather than with voltage, where the encoding further comprises providing two one-bit adders using a double-encoding non-complementary design.

5. A circuit, comprising:
a time encoder to encode information to provide a signal in the time domain rather than with voltage, the time encoder including two one-bit adders using a double-encoding non-complementary design.

6. The circuit of claim 5, further including a time logic to process the information in the time domain.

7. The circuit of claim 5, further including a time decoder to convert the information into the digital domain.

8. The circuit of claim 5, where the time encoder comprises a single inverter.

9. The circuit of claim 8, where the inverter experiences a constant value during encoding to provide almost no impact to energy consumption.

10. The circuit of claim 8, where the inverter comprises stacked transistors always turned on.

11. A winner-take-all circuit, comprising:
a digital signal processor including a time encoder, a time logic and a time decoder, where the time encoder, time logic and time decoder are configured to provide time domain signal processing to encode inputted information in a time domain rather than voltage; and
where the digital signal processor comprises a first stage configured to provide a plurality of inputs to the digital signal processor and a second stage to compare a winner of each branch of the plurality of inputs of the first stage.

12. The circuit of claim 11 further comprising a single NAND gate or NOR gate to directly pass an output of the winner of the first stage to the second stage without intermediate restoration or regeneration.

13. The circuit of claim 11 further comprising a time domain equal detector connected with the plurality of inputs.

14. The circuit of claim 13 where an output of the time domain equal detector is discharged to ground only when the plurality of inputs are separated in time.

15. A system, comprising:
a digital signal processor including a time encoder, a time logic and a time decoder, where the time encoder, time logic and time decoder are configured to provide time domain signal processing of inputted information in a time domain rather than voltage;
where the digital signal processor comprises an adder, where the adder comprises two cascaded time encoders and two inverters to remove slew rate impacts among stages, and where the time encoder is configured to control a strength of a pull-up/pull-down network to achieve a modulation of delay.

16. The system of claim 15 where the time encoder is configured to encode the inputted information in the time domain.

17. The system of claim 16 where the encoding comprises a double encoding non-complementary logic design.

18. The system of claim 16 where the encoding reduces energy and area consumption by up to about forty percent compared with voltage encoding.

19. The system of claim 16 where the encoding reduces energy and area consumption by up to about three times compared with voltage encoding.

20. A system, comprising:
a digital signal processor including a time encoder, a time logic and a time decoder, where the time encoder, time logic and time decoder are configured to provide time domain signal processing to encode inputted information in a time domain rather than voltage;
where the digital signal processor comprises an adder, and where the adder comprises two cascaded time encoders and two inverters to remove slew rate impacts among stages.

* * * * *